United States Patent
Zhou et al.

(10) Patent No.: US 10,351,766 B2
(45) Date of Patent: *Jul. 16, 2019

(54) PHOSPHOR, FABRICATING METHOD THEREOF, METHOD FOR REGULATING CRYSTAL PHASE THEREOF, AND METHOD FOR CHANGING CRYSTAL PHASE HEREOF

(71) Applicant: LEXTAR ELECTRONICS CORPORATION, Hsinchu (TW)

(72) Inventors: Wen-Li Zhou, ChangSha (CN); Wei-Lun Wu, Tainan (TW); Ru-Shi Liu, New Taipei (TW); Yu-Chun Lee, Hsinchu County (TW); Ching-Yi Chen, New Taipei (TW); Tzong-Liang Tsai, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 203 days.

This patent is subject to a terminal disclaimer.

(21) Appl. No.: 15/364,207

(22) Filed: Nov. 29, 2016

(65) Prior Publication Data

US 2017/0190968 A1   Jul. 6, 2017

(30) Foreign Application Priority Data

Jan. 6, 2016   (TW) .............................. 105100255 A

(51) Int. Cl.
| | | |
|---|---|---|
| *C30B 7/14* | (2006.01) | |
| *C09K 11/66* | (2006.01) | |
| *C30B 29/12* | (2006.01) | |

(52) U.S. Cl.
CPC .............. *C09K 11/665* (2013.01); *C30B 7/14* (2013.01); *C30B 29/12* (2013.01)

(58) Field of Classification Search
CPC ........ C09K 11/668; C30B 17/14; C30B 29/12
See application file for complete search history.

(56) References Cited

U.S. PATENT DOCUMENTS

| | | | |
|---|---|---|---|
| 7,497,973 | B2 | 3/2009 | Radkov et al. |
| 8,237,348 | B2 | 8/2012 | Masuda et al. |

(Continued)

FOREIGN PATENT DOCUMENTS

| | | |
|---|---|---|
| CN | 101705095 | 5/2010 |
| CN | 102732249 A | 10/2012 |

(Continued)

OTHER PUBLICATIONS

Wei et al, "Photoluminescent Evolution Induced by Structural Transformation Through Thermal Treating in the Red Narrow-Band Phosphor K2GeF6:Mn4+", ACS Appl. Mater. Interfaces, vol. 7, #20, May 11, 2015, pp. 10656-10659.*

(Continued)

*Primary Examiner* — C Melissa Koslow

(57) ABSTRACT

The present disclosure provides a method for fabricating a phosphor. A first solution is formed by dissolving potassium hexafluorogermanate ($K_2GeF_6$) and either $K_2MnF_6$ or $KMnO_4$ in a hydrofluoric acid solution. An anhydrous ethanol is added to the first solution to make a total concentration of fluoride ions of potassium hexafluorogermanate ($K_2GeF_6$), hydrofluoric acid, and either $K_2MnF_6$ or $KMnO_4$ equal to or less than 48M to form a precipitate. Afterward, the precipitate is collected.

15 Claims, 6 Drawing Sheets

(56) References Cited

U.S. PATENT DOCUMENTS

| | | |
|---|---|---|
| 8,252,613 B1 | 8/2012 | Lyons et al. |
| 8,362,685 B2 | 1/2013 | Masuda et al. |
| 8,491,816 B2 | 7/2013 | Hong et al. |
| 10,040,994 B2 * | 8/2018 | Lin ................ C09K 11/665 |
| 2006/0169998 A1 | 8/2006 | Radkov et al. |
| 2012/0161170 A1 | 6/2012 | Dubuc et al. |
| 2015/0008463 A1 | 1/2015 | Yoshida |
| 2015/0035430 A1 | 2/2015 | Yoshida et al. |
| 2015/0048399 A1 | 2/2015 | Weiler et al. |

FOREIGN PATENT DOCUMENTS

| | | |
|---|---|---|
| CN | 103980896 A | 8/2014 |
| CN | 104893718 A | 9/2015 |
| CN | 105038776 A | 11/2015 |
| EP | 2508586 A2 | 10/2012 |
| EP | 2663611 A1 | 7/2014 |
| JP | 2013-014715 | 1/2013 |
| WO | WO 2009119486 A1 | 10/2009 |
| WO | WO 2013088313 A1 | 6/2013 |
| WO | WO 2017/114108 * | 7/2017 |

OTHER PUBLICATIONS

Supporting Information for Wei et al, "Photoluminescent Evolution Induced by Structural Transformation Through Thermal Treating in the Red Narrow-Band Phosphor K2GeF6:Mn4+", ACS Appl. Mater. Interfaces, vol. 7, #20, May 11, 2015.*

Translation for WO 2017/114108, Jul. 6, 2017.*

Ling-Ling Wei et al., "Photoluminescent Evolution Induced by Structural Transformation Through Thermal Treating in the Red Narrow-Band Phosphor $K_2GeF_6$:$Mn^{4+}$," Applied Materials & Interfaces, May 2015, pp. 10656-10659, vol. 7, ACS Publications, US.

Ling-Ling Wei et al., "A Low-Temperature Co-Precipitation Approach to Synthesize Fluoride Phosphors $K_2MF_6$:$Mn^{4+}$ (M=Ge, Si) for White LED Applications," Journal of Materials Chemistry C, Jan. 2015, pp. 1655-1660, vol. 3, Royal Society of Chemistry, UK.

Daisuke Sekiguchi et al., "Synthesis and Photoluminescence Spectroscopy of $BaGeF_6$:$Mn^{4+}$ Red Phosphor," Optical Materials, Apr. 2015, pp. 417-422, vol. 42, Elsevier, US.

Qiang Zhou et al., "A New Red Phosphor $BaGeF_6$:$Mn^{4+}$: Hydrothermal Synthesis, Photo-Luminescence Properties, and Its Application in Warm White LED Devices," Journal of Materials Chemistry C, Feb. 2015, pp. 3055-3059, vol. 3, The Royal Society of Chemistry, UK.

Xianyu Jiang et al., "A Red Phosphor $BaTiF_6$:$Mn^{4+}$: Reaction Mechanism, Microstructures, Optical Properties, and Applications for White LEDs," Dalton Transactions, Apr. 2014, pp. 9414-9418, vol. 43, The Royal Society of Chemistry, UK.

Lifen Lv et al., "The Formation Mechanism, Improved Photoluminescence and LED Applications of Red Phosphor $K_2SiF_6$:$Mn^{4+}$," Journal of Materials Chemistry C, Mar. 2014, pp. 3879-3884, vol. 2, The Royal Society of Chemistry, UK.

Xianyu Jiang et al., "Hydrothermal Synthesis and Photoluminescence Properties of Red Phosphor $BaSiF_6$:$Mn^{4+}$ for LED Applications," Journal of Materials Chemistry C, Jan. 2014, pp. 2301-2306, vol. 2, The Royal Society of Chemistry, UK.

Sadao Adachi et al., "Synthesis and Properties of Hetero-Dialkaline Hexafluorosilicate Red Phosphor $KNaSiF_6$:$Mn^{4+}$," Journal of The Electrochemical Society, Dec. 2011, pp. J34-J37, vol. 159, The Electrochemical Society, US.

Ryota Kasa et al. "Red and Deep Red Emissions from Cubic $K_2SiF_6$:$Mn^{4+}$ and Hexagonal $K_2MnF_6$ Synthesized in $HF/KMnO_4$/$KHF_2$/Si Solutions," Journal of The Electrochemical Society, Jan. 2012, pp. J89-J95, vol. 159, The Electrochemical Society, US.

Sadao Adachi et al., "Photoluminescent Properties of $K_2GeF_6$:$Mn^{4+}$ Red Phosphor Synthesized from Aqueous $HF/KMnO_4$ Solution," Journal of Applied Physics, Jul. 2009, pp. 013516(1)-013516(6), vol. 106, AIP Publishing, US.

Toru Takahashi et al. "$Mn^{4+}$-Activated Red Photoluminescence in $K_2SiF_6$ Phosphor," Journal of The Electrochemical Society, Oct. 2008, pp. E183-E188, vol. 155, The Electrochemical Society, US.

Taiwan Patent Office, Office Action, Patent Application Serial No. 105100255, dated May 11, 2016, Taiwan.

China Patent Office, Office Action, Patent Application Serial No. 201611066773.5, dated Dec. 19, 2018, China.

* cited by examiner

300

> providing a first solution, wherein the first solution is formed by dissolving potassium hexafluorogermanate ($K_2GeF_6$) and either $K_2MnF_6$ or $KMnO_4$ in a hydrofluoric acid solution —302

> adding an anhydrous ethanol to the first solution to regulate a total concentration of fluoride ions of potassium hexafluorogermanate ($K_2GeF_6$), hydrofluoric acid, and either $K_2MnF_6$ or $KMnO_4$ to control the crystal phase of a resulting precipitate —304

> providing a first solution, wherein the first solution is formed by dissolving potassium hexafluorogermanate ($K_2GeF_6$) and either $K_2MnF_6$ or $KMnO_4$ in a hydrofluoric acid solution — 402

> adding an anhydrous ethanol to the first solution to make a total concentration of fluoride ions of potassium hexafluorogermanate ($K_2GeF_6$), hydrofluoric acid, and either $K_2MnF_6$ or $KMnO_4$ be in a range of about 16M to about 23M to change the crystal phase of a resulting precipitate — 404

FIG. 4

PHOSPHOR, FABRICATING METHOD THEREOF, METHOD FOR REGULATING CRYSTAL PHASE THEREOF, AND METHOD FOR CHANGING CRYSTAL PHASE HEREOF

CROSS REFERENCE TO RELATED APPLICATIONS

This application is based on, and claims priority from, Taiwan Application Serial Number 105100255, filed on Jan. 6, 2016, the disclosure of which is hereby incorporated by reference herein in its entirety.

BACKGROUND

Technical Field

The disclosure relates to a phosphor, a fabricating method thereof, a method for regulating the crystal phase thereof and a method for changing the crystal phase thereof.

Description of the Related Art

In recent years, energy-saving and environmental-protection concepts have been a major concern. As new lighting sources, light-emitting diodes (LEDs) can solve the problems that cannot be conquered by traditional incandescent lamps or fluorescent lamps. Also, LEDs meet the requirements of low power consumption and environmental protection. Therefore, issues such as exploiting new energies and increasing energy efficiency have attracted public attention. Color LEDs have been used widely in colored lighting, displays, entertainment, and so on. The development of the electronic display industry has been the most rapid. It is believed that LEDs will play an important role in photoelectric element applications in the future.

So far, the development of white light-emitting diodes (WLEDs) has been the main developmental direction of LEDs globally. WLEDs have advantages such as small size, low heat radiation, long life, low power consumption, and vibration resistance. WLEDs solve the problems that cannot be conquered by traditional lamps.

One of the most common WLEDs used in the industry include blue LED chips accompanied by YAG phosphor ($Y_3Al_5O_{12}$:Ce; Yttrium aluminum garnet). However, in order to remedy the red light spectrum which YAG phosphor ($Y_3Al_5O_{12}$:Ce; Yttrium aluminum garnet) lacks, the process for the red light-emitting phosphor-added WLEDs has become a new issue. In general synthesis methods for red light-emitting phosphors, fluorides are co-crystallized by evaporating hydrogen fluoride (HF) at a high temperature. However, the operation of such methods is dangerous and the hydrogen fluoride (HF) has to be recycled subsequently.

Inorganic fluoride $K_2[GeF_6]$ has three crystal structures, including a hexagonal phase with a $P\bar{3}m1$ space group, a hexagonal phase with a $P6_3mc$ space group, and a cubic phase with a Fm3m space group. Related studies indicate that $K_2[GeF_6]$:$Mn^{4+}$ phosphors with a hexagonal phase with a $P\bar{3}m1$ space group show a red light line spectrum in a range of about 600 nm to about 650 nm, but do not show a zero phonon line (ZPL) near 620 nm. The emission characteristics of $K_2[GeF_6]$:$Mn^{4+}$ phosphors with a hexagonal phase with a $P6_3mc$ space group are very similar to that of $K_2[GeF_6]$:$Mn^{4+}$ phosphors with a hexagonal phase with a $P\bar{3}m1$ space group. However, $K_2[GeF_6]$:$Mn^{4+}$ phosphors with a hexagonal phase with a $P6_3mc$ space group show a zero phonon line (ZPL). In previous studies, formulas were adjusted to make phosphors produce a zero phonon line (ZPL). However, so far, there is still no method using chemical recrystallization to control the crystal phase of phosphors and regulate the production of crystal phase change and zero phonon line (ZPL).

Therefore, a safe and fast method for fabricating a red light-emitting phosphor capable of increasing the color rendering index for WLEDs, a method capable of controlling the crystal phases of phosphors, and a method for producing a crystal phase change and a zero phonon line (ZPL) are needed.

BRIEF SUMMARY

According to an embodiment, a method for fabricating a phosphor is provided. In an embodiment of the method for fabricating the phosphor, a first solution is provided. The first solution is formed by dissolving potassium hexafluorogermanate ($K_2GeF_6$) and either $K_2MnF_6$ or $KMnO_4$ in a hydrofluoric acid solution. An anhydrous ethanol is added to the first solution to make the total concentration of fluoride ions of potassium hexafluorogermanate ($K_2GeF_6$), hydrofluoric acid, and either $K_2MnF_6$ or $KMnO_4$ equal to or less than 48M to form a precipitate. Afterward, the precipitate is collected.

According to another embodiment, a method for fabricating a phosphor is provided. In an embodiment of the method for fabricating the phosphor, a first solution is provided. The first solution is formed by dissolving potassium hexafluorogermanate ($K_2GeF_6$) and either $K_2MnF_6$ or $KMnO_4$ in a hydrofluoric acid solution. An anhydrous ethanol is added to the first solution to make the total concentration of fluoride ions of potassium hexafluorogermanate ($K_2GeF_6$), hydrofluoric acid, and either $K_2MnF_6$ or $KMnO_4$ equal to or less than 16M to form a precipitate. Afterward, the precipitate is collected.

According to another embodiment, a phosphor is provided. The phosphor is represented by the following formula: $K_2[Ge_{1-x}F_6]$:$Mn_x^{4+}$, wherein $0<x<0.2$. The phosphor has a hexagonal phase with a $P6_3mc$ space group. The phosphor is fabricated by the method described above.

According to yet another embodiment, a method for regulating a crystal phase of a phosphor is provided. In an embodiment of the method for fabricating the phosphor, a first solution is provided. The first solution is formed by dissolving potassium hexafluorogermanate ($K_2GeF_6$) and either $K_2MnF_6$ or $KMnO_4$ in a hydrofluoric acid solution. An anhydrous ethanol is added to the first solution to regulate the total concentration of fluoride ions of potassium hexafluorogermanate ($K_2GeF_6$), hydrofluoric acid, and either $K_2MnF_6$ or $KMnO_4$ to control the crystal phase of a resulting precipitate.

According to still another embodiment, a method for changing a crystal phase of a phosphor is provided. In an embodiment of the method for fabricating the phosphor, a first solution is provided. The first solution is formed by dissolving potassium hexafluorogermanate ($K_2GeF_6$) and either $K_2MnF_6$ or $KMnO_4$ in a hydrofluoric acid solution. An anhydrous ethanol is added to the first solution to make the total concentration of fluoride ions of potassium hexafluorogermanate ($K_2GeF_6$), hydrofluoric acid, and either $K_2MnF_6$ or $KMnO_4$ be in a range of about 16M to about 23M to change the crystal phase of a resulting precipitate. The change of the crystal phase includes a change between a hexagonal phase with a $P\bar{3}m1$ space group and a hexagonal phase with a $P6_3mc$ space group.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 3 is a flow diagram illustrating a method for regulating a crystal phase of a phosphor in accordance with another embodiment of the present disclosure;

FIG. 4 is a flow diagram illustrating a method for changing a crystal phase of a phosphor in accordance with another embodiment of the present disclosure;

DETAILED DESCRIPTION

Figure 1:
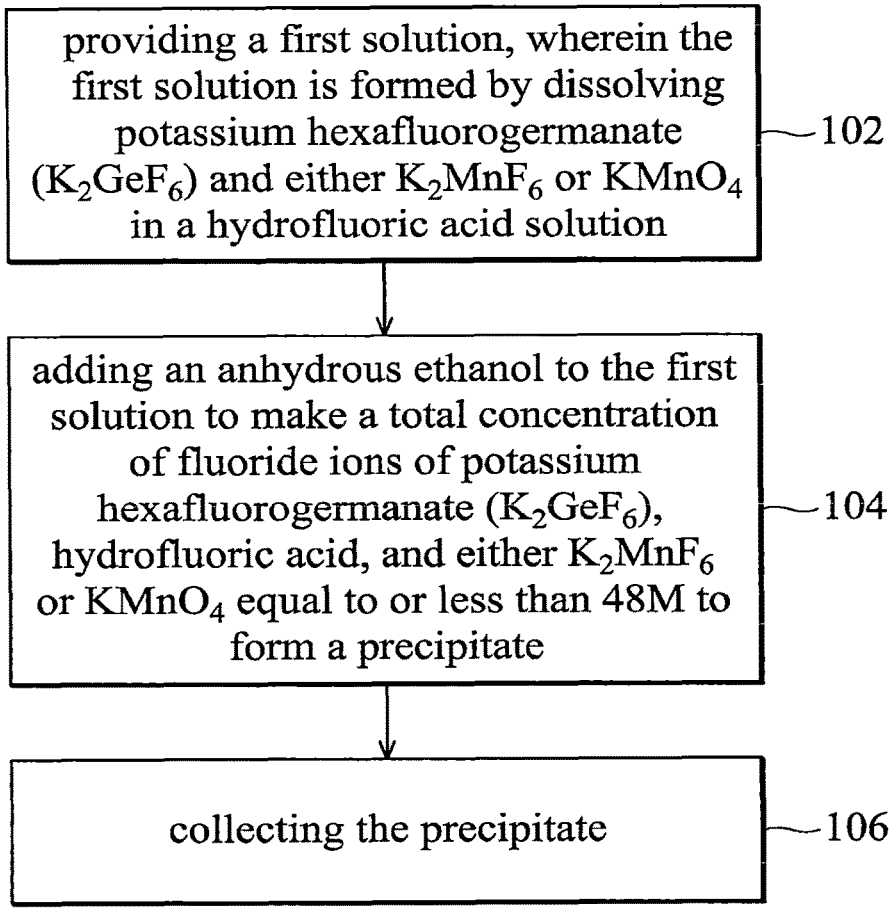
FIG. 1 is a flow diagram illustrating a method for fabricating a phosphor in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the disclosure.

The present disclosure provides a method for fabricating a phosphor and a phosphor fabricated by this method. Chemical recrystallization method is used to directly synthesize a red light-emitting phosphor $K_2[Ge_{1-x}F_6]:Mn_x^{4+}$ having a hexagonal phase. Red light-emitting phosphors are formed by adding an anhydrous ethanol to reduce the total concentration of fluoride ions in the solution. This method can be performed without evaporating hydrogen fluoride (HF) at a high temperature, and thus avoiding the danger in operation and a subsequent recycle of hydrogen fluoride (HF).

In one embodiment, a method 100 for fabricating a phosphor is provided. FIG. 1 is a flow diagram illustrating the method 100 for fabricating a phosphor in accordance with an embodiment of the present disclosure.

Firstly, the method 100 proceeds to step 102 by providing a first solution. The first solution is formed by dissolving potassium hexafluorogermanate ($K_2GeF_6$) and either $K_2MnF_6$ or $KMnO_4$ in a hydrofluoric acid solution. In step 102, $K_2MnF_6$ or $KMnO_4$ serves as the source of luminescence center Mn of the resulting phosphor.

Next, the method 100 proceeds to step 104 by adding an anhydrous ethanol to the first solution to make the total concentration of fluoride ions of potassium hexafluorogermanate ($K_2GeF_6$), hydrofluoric acid, and either $K_2MnF_6$ or $KMnO_4$ equal to or less than 48M to form a precipitate. Phosphors decompose when water is present. The resulting phosphors of the present disclosure are stable in the anhydrous ethanol. In addition, fluoride phosphors may be dissolved in a solution with a high fluoride ions concentration. If the concentration of fluoride ions is reduced, fluoride phosphors may be re-crystallized. Therefore, in this step, a solvent, which is not detrimental to the resulting phosphor and is able to separate out the phosphor effectively, may be selected. In the present disclosure, anhydrous ethanol is added to reduce the total concentration of fluoride ions in the solution to re-crystallize the phosphor. Step 102 and step 104 may both be performed at room temperature. For example, the temperature may be in a range of about 20° C. to about 30° C. For example, the temperature may be 25° C. Moreover, the reaction time for steps 102 to 104 may be in a range of about 10 minutes to about 30 minutes. For example, the reaction time may be 10 minutes, 20 minutes, or 30 minutes. So far, in general methods for fabricating red light-emitting phosphors, fluorides are co-crystallized by evaporating hydrofluoric acid (HF) at a high temperature (such as 70° C.). In contrast, the method 100 for fabricating the phosphor provided in the present disclosure may be performed at normal temperature. Also, the reaction may be finished in a short reaction time such as 20 minutes.

It should be noted that, in step 104, when the total concentration of fluoride ions of potassium hexafluorogermanate ($K_2GeF_6$), hydrofluoric acid, and either $K_2MnF_6$ or $KMnO_4$ is regulated to be equal to or less than 48M by adding an anhydrous ethanol, the crystal of red light-emitting phosphors may be successfully formed. With the change of the total concentration of fluoride ions, the phosphor may have a particle size in a range of about 0.3 μm to about 30 μm. For example, the phosphor may have a particle size in a range of about 0.3 μm to about 1 μm, about 10 μm to about 20 μm, or about 15 μm to about 30 μm. However, in some other embodiments, the total concentration of fluoride ions may be adjusted by the amount of the added anhydrous ethanol. For example, in one embodiment, an anhydrous ethanol may be added into the first solution to make the total concentration of fluoride ions of potassium hexafluorogermanate ($K_2GeF_6$), hydrofluoric acid, and either $K_2MnF_6$ or $KMnO_4$ be in a range of about 23M to 48M. For example, the total concentration of fluoride ions may be 16.42M or 21.56M. In such cases, the resulting red light-emitting phosphors may have a particle size in a range of about 10 μm to about 30 μm. For example, the resulting red light-emitting phosphors may have a particle size in a range of about 10 μm to about 20 μm, or about 15 μm to about 30 μm.

Finally, the method 100 proceeds to step 106 by collecting the precipitate formed in step 104. The collected precipitate is the $K_2[Ge_{1-x}F_6]:Mn_x^{4+}$ phosphor described in the present disclosure. The method for collecting the precipitate may include well-known techniques such as washing, filtration, and dry. In one embodiment, the phosphor may be dried at a temperature in a range of about 40° C. to about 80° C. For example, the temperature may be 50° C. or 60° C. The phosphor may emit a red light having a peak wavelength in a range of about 600 nm to about 650 nm after being excited by a light having a peak wavelength in a range of about 320 nm to about 500 nm.

Figure 2:
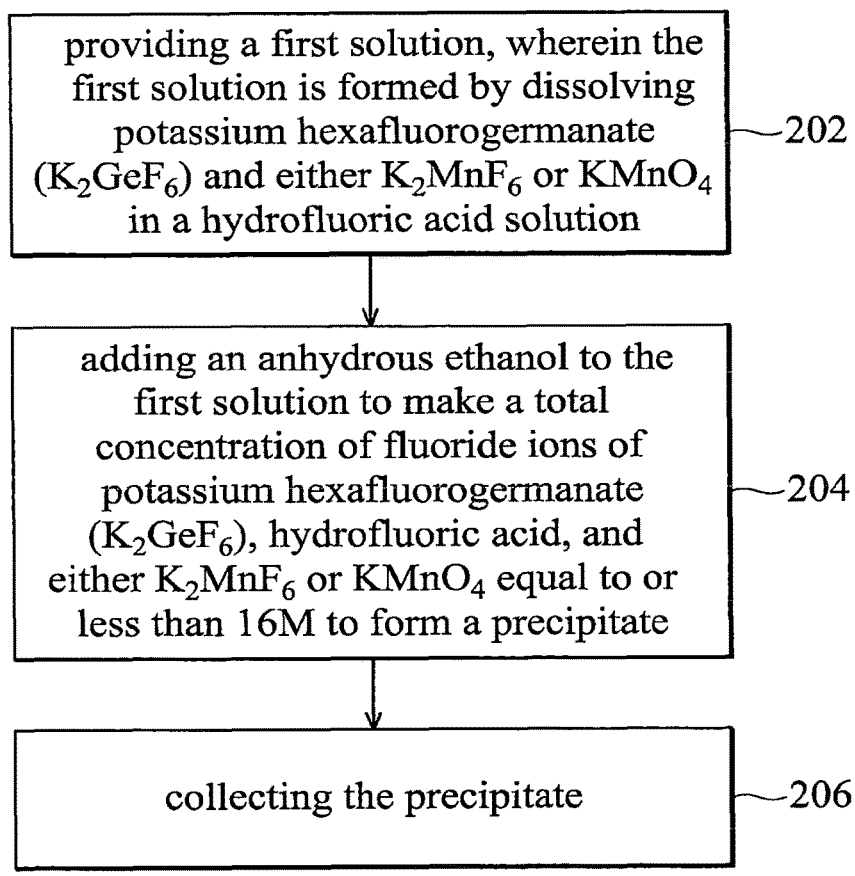
FIG. 2 is a flow diagram illustrating a method for fabricating a phosphor in accordance with another embodiment of the present disclosure.

In another embodiment, a method 200 for fabricating a phosphor is provided. FIG. 2 is a flow diagram illustrating the method 200 for fabricating a phosphor in accordance with an embodiment of the present disclosure.

Firstly, the method 200 proceeds to step 202 by providing a first solution. Step 202 of method 200 is the same as step 102 of method 100. Next, the method 200 proceeds to step 204 by adding an anhydrous ethanol to the first solution to make the total concentration of fluoride ions of potassium hexafluorogermanate ($K_2GeF_6$), hydrofluoric acid, and either $K_2MnF_6$ or $KMnO_4$ equal to or less than 16M to form a precipitate. Step 202 and step 204 may both be performed at room temperature. For example, the temperature may be in a range of about 20° C. to about 30° C. For example, the temperature may be 25° C. Moreover, the reaction time for steps 202 to 204 may be in a range of about 10 minutes to about 30 minutes. For example, the reaction time may be 10 minutes, 20 minutes, or 30 minutes. Similarly, the method 200 for fabricating the phosphor provided in the present disclosure may be performed at normal temperature. Also, the reaction may be finished in a short reaction time such as 20 minutes.

The difference between step 204 of method 200 and step 104 of method 100 is that the total concentration of fluoride ions of potassium hexafluorogermanate ($K_2GeF_6$), hydrofluoric acid, and either $K_2MnF_6$ or $KMnO_4$ is controlled to be equal to or less than 16M in step 204. In such case, the resulting red light-emitting phosphor shows a zero phonon line (ZPL) at about 620 nm to about 625 nm. Also, the resulting red light-emitting phosphor has a particle size in a range of about 0.3 μm to about 1 μm.

Finally, the method 200 proceeds to step 206 by collecting the precipitate formed in step 204. The collected precipitate is the $K_2[Ge_{1-x}F_6]:Mn_x^{4+}$ phosphor described in the present disclosure. The method for collecting the precipitate may refer to the description of step 102. The phosphor may emit a red light having a peak wavelength in a range of about 600 nm to about 650 nm after being excited by a light having a peak wavelength in a range of about 320 nm to about 500 nm.

In another embodiment, a phosphor fabricated by the method 200 is also provided. The phosphor is represented by the following formula: $K_2[Ge_{1-x}F_6]:Mn_x^{4+}$, wherein $0<x<0.2$. The phosphor has a hexagonal phase with a $P6_3mc$ space group. The phosphor may emit a red light having a peak wavelength in a range of about 600 nm to about 650 nm after being excited by a light having a peak wavelength in a range of about 320 nm to about 500 nm. Also, the phosphor shows a zero phonon line (ZPL) at about 620 nm to about 625 nm. The phosphor may have a particle size in a range of about 0.3 μm to about 1 μm. In one embodiment, the formula of the phosphor may be $K_2[Ge_{0.9}F_6]:Mn_{0.1}^{4+}$.

It should be noted that the excitation light, which excites the red light-emitting phosphor provided in the present disclosure, has a peak wavelength which does not overlap with the peak wavelength of yellow light (from about 570 nm to about 590 nm). Accordingly, in a light-emitting apparatus containing an LED, for example, the possibility is low that the yellow light-emitting phosphor-generated yellow light, which is excited by the LED (such as a blue LED), will be absorbed by the red light-emitting phosphor provided in the present disclosure. Therefore, the color rendering index of the light-emitting apparatus may be increased by avoiding the loss of yellow light and by the red light generated by the red light-emitting phosphor provided in the present disclosure. In addition, it should also be noted that the excitation light, which excites the red light-emitting phosphor provided in the present disclosure, has a peak wavelength which does not overlap with the peak wavelength of green light (from about 495 nm to about 570 nm). Accordingly, in a light-emitting apparatus containing an LED, for example, the possibility is low that the green light-emitting phosphor-generated green light, which is excited by the LED (such as a blue LED), will be absorbed by the red light-emitting phosphor provided in the present disclosure. Therefore, the color rendering index of the light-emitting apparatus may be increased by avoiding the loss of green light and by the red light generated by the red light-emitting phosphor provided in the present disclosure. Therefore, any light having a peak wavelength in the range of about 300 nm to about 500 nm may be used as the excitation light of the phosphor provided in the present disclosure.

In one embodiment, the $K_2[Ge_{1-x}F_6]:Mn_x^{4+}$ phosphor of the present disclosure may be blended with other phosphors. For example, it may be blended with a yellow light-emitting phosphor (such as a YAG yellow light-emitting phosphor or a silicate yellow light-emitting phosphor) and/or a green light-emitting phosphor (such as a β-SiAlON green light-emitting phosphor, a YAG green light-emitting phosphor, a silicate green light-emitting phosphor, or a nitride green light-emitting phosphor). The yellow light-emitting phosphor and/or the green light-emitting phosphor may be blended with the red light-emitting phosphor provided in the present disclosure to emit white light after being excited by blue light. In the blended phosphor, the ratio of the yellow light-emitting phosphor, the green light-emitting phosphor, and the red light-emitting phosphor is not limited. The ratio of any two of the blended phosphor may be in a range of 1:99 to 99:1. For example, the ratio of the yellow light-emitting phosphor, the green light-emitting phosphor, and the red light-emitting phosphor may be 1:1:1. The above ratio may be adjusted according to the actual need and the desired properties of the phosphor. The wavelength of the blue light which serves as the excitation light may be in a range of about 400 nm to about 500 nm, preferably from about 440 nm to about 480 nm. It should be noted that the excitation light, which excites the red light-emitting phosphor provided in the present disclosure, has a peak wavelength which does not overlap with the peak wavelength of yellow light (from about 570 nm to about 590 nm) and the peak wavelength of green light (from about 495 nm to about 570 nm). Accordingly, in a light-emitting apparatus such as an LED (for example, a blue LED) containing yellow light-emitting and/or green light-emitting luminescent materials, the color rendering index of the light-emitting apparatus may be increased by avoiding the loss of yellow light and/or green light and by the red light generated by the red light-emitting phosphor provided in the present disclosure.

From the above, the amount of fluoride ions in the reaction solution will affect the formation of phosphors. When the total concentration of fluoride ions is too high (i.e. more than 48M), fluoride ion complexes $[Ge_{1-x}Mn_xF_6]^{2-}$ are formed and dissolved in HF solution, thereby the product cannot be precipitated. However, when the total concentration gradually decreases to in a range of about 23M to 48M, it is not easy for fluoride ion complexes $[Ge_{1-x}Mn_xF_6]^{2-}$ to be formed. In such case, the product is precipitated as a yellow precipitate. The resulting product has a hexagonal phase with a $P\bar{3}m1$ space group. Also, the resulting product emits a red light having a peak wavelength in a range of about 600 nm to about 650 nm after being excited by a light having a peak wavelength in a range of about 320 nm to about 500 nm. It was found that the resulting product has a hexagonal phase with a P6$_3$mc space group when the total fluoride ion concentration is decreased further, to less than 16M. The resulting product may not only emit a red light having a peak wavelength in a range of about 600 nm to about 650 nm but also show a zero phonon line (ZPL) at about 620 nm to about 625 nm.

In another embodiment, a method for regulating a crystal phase of a phosphor is also provided. An anhydrous ethanol is added to control the total concentration of fluoride ions of solution and further control the crystal phase of the resulting red light-emitting phosphor. FIG. 3 is a flow diagram illustrating a method 300 for regulating a crystal phase of a phosphor in accordance with another embodiment of the present disclosure.

Firstly, the method 300 proceeds to step 302 by providing a first solution. The first solution is formed by dissolving potassium hexafluorogermanate (K$_2$GeF$_6$) and either K$_2$MnF$_6$ or KMnO$_4$ in a hydrofluoric acid solution. In step 302, K$_2$MnF$_6$ or KMnO$_4$ serves as the source of luminescence center Mn of the resulting phosphor.

Next, the method 300 proceeds to step 304 by adding an anhydrous ethanol to the first solution to control the total concentration of fluoride of the potassium hexafluorogermanate (K$_2$GeF$_6$), hydrofluoric acid, and either K$_2$MnF$_6$ or KMnO$_4$ to control the crystal phase of the resulting precipitate.

In one embodiment, in step 304, an anhydrous ethanol is added to the first solution to regulate the total concentration of fluoride ions of potassium hexafluorogermanate (K$_2$GeF$_6$), hydrofluoric acid, and either K$_2$MnF$_6$ or KMnO$_4$ to be in a range of about 23M to about 48M, such as 38.33M or 31.36M, to make the phosphor have a hexagonal phase with a P$\overline{3}$m1 space group. The resulting phosphor may emit a red light having a peak wavelength in a range of about 600 nm to about 650 nm after being excited by a light having a peak wavelength in a range of about 320 nm to about 500 nm.

In another embodiment, in step 304, an anhydrous ethanol is added to the first solution to regulate the total concentration of fluoride ions of potassium hexafluorogermanate (K$_2$GeF$_6$), hydrofluoric acid, and either K$_2$MnF$_6$ or KMnO$_4$ to be equal to or less than 16M, such as 13.26M or 14.37M, to make the phosphor have a hexagonal phase with a P6$_3$mc space group. The resulting phosphor may emit a red light having a peak wavelength in a range of about 600 nm to about 650 nm after being excited by a light having a peak wavelength in a range of about 320 nm to about 500 nm. Moreover, the resulting phosphor shows a zero phonon line (ZPL) at about 620 nm to about 625 nm.

In yet another embodiment, in step 304, an anhydrous ethanol is added to the first solution to regulate the total concentration of fluoride ions of potassium hexafluorogermanate (K$_2$GeF$_6$), hydrofluoric acid, and either K$_2$MnF$_6$ or KMnO$_4$ to be in a range of about 16M to about 23M, such as 16.42M or 21.56M, to make the phosphor simultaneously have a hexagonal phase with a P$\overline{3}$m1 space group and a hexagonal phase with a P6$_3$mc space group. It is deduced that the crystal phase change of phosphors between the hexagonal phase with a P$\overline{3}$m1 space group and the hexagonal phase with a P6$_3$mc space group occurs when the total concentration of fluoride ions is in a range of about 16M to about 23M.

Step 302 and step 304 may both be performed at room temperature. For example, the temperature may be in a range of about 20° C. to about 30° C. For example, the temperature may be 25° C. Moreover, the reaction time for steps 302 to 304 may be in a range of about 10 minutes to about 30 minutes. For example, the reaction time may be 10 minutes, 20 minutes, or 30 minutes.

In addition, a method for changing a crystal phase of a phosphor is also provided. An anhydrous ethanol is added to regulate the total concentration of fluoride ions in the solution to make the red light-emitting phosphor change the crystal phase. FIG. 4 is a flow diagram illustrating a method 400 for changing a crystal phase of a phosphor in accordance with another embodiment of the present disclosure.

Firstly, the method 400 proceeds to step 402 by providing a first solution. The first solution is formed by dissolving potassium hexafluorogermanate (K$_2$GeF$_6$) and either K$_2$MnF$_6$ or KMnO$_4$ in a hydrofluoric acid solution. In step 402, K$_2$MnF$_6$ or KMnO$_4$ serves as the source of luminescence center Mn of the resulting phosphor.

Next, the method 400 proceeds to step 404 by adding an anhydrous ethanol to the first solution to make the total concentration of fluoride ions of potassium hexafluorogermanate (K$_2$GeF$_6$), hydrofluoric acid, and either K$_2$MnF$_6$ or KMnO$_4$ be in a range of about 16M to about 23M to make the resulting precipitate change the crystal phase. The change of the crystal phase may include a change between a hexagonal phase with a P$\overline{3}$m1 space group and a hexagonal phase with a P6$_3$mc space group. Step 402 and step 404 may both be performed at room temperature. For example, the temperature may be in a range of about 20° C. to about 30° C. For example, the temperature may be 25° C. Moreover, the reaction time for steps 402 to 404 may be in a range of about 10 minutes to about 30 minutes. For example, the reaction time may be 10 minutes, 20 minutes, or 30 minutes.

The present disclosure provides a phosphor formed by chemical recrystallization and a fabricating method thereof. In general synthesis methods for red light-emitting phosphors, fluorides are co-crystallized by evaporating hydrogen fluoride (HF) at a high temperature. However, the operation of such method is dangerous and the hydrogen fluoride (HF) has to be recycled subsequently. The fabricating method for phosphors provided in the present disclosure forms red light-emitting phosphors by adding an anhydrous ethanol at room temperature to decrease the total concentration of fluoride ions in the solution. Since there is no need to evaporate hydrogen fluoride (HF) at a high temperature, the method is safe and fast. Moreover, by regulating the amount of anhydrous ethanol, the resulting red light-emitting phosphor may change the crystal phase to a hexagonal phase with a P6$_3$mc space group and show a zero phonon line (ZPL) at about 620 nm to about 625 nm.

In addition, according to the above results, the present disclosure further provides a method for regulating a crystal phase of a phosphor and a method for changing a crystal phase of a phosphor. These methods may be performed at room temperature. Moreover, these methods directly control the crystal phase of phosphors by adding an anhydrous ethanol to control the total concentration of fluoride ions in the solution, so there is no need to evaporate hydrogen fluoride (HF) at a high temperature. These methods are safer and easier in operation. By regulating the crystal phase of phosphors, the resulting red light-emitting phosphor showing a zero phonon line (ZPL) may applied to, for example, a blue light-emitting element to improve the color rendering index.

The Examples are described below to illustrate the method for fabricating the phosphor, and the properties of the phosphor.

Examples 1-3: Fabricating $K_2Ge_{0.9}F_6:Mn_{0.1}^{4+}$ Phosphors Under Different Conditions

Example 1

0.4776 g (1.8 mmol) of potassium hexafluorogermanate ($K_2GeF_6$) and 0.0494 g (0.2 mmol) of $K_2MnF_6$ were dissolved in 10 mL, 48 wt % of hydrofluoric acid (HF) solution at 25° C. and stirred for 10 minutes to form a first solution. Then, 20 mL of anhydrous ethanol was added to the first solution at room temperature and stirred for 10 minutes to produce a precipitate. Afterwards, after being washed twice with 30 mL of ethanol and washed once with 30 mL of acetone, the precipitate was oven-dried at 50° C. for 2 hours. Then, 0.5050 g of $K_2Ge_{0.9}F_6:Mn_{0.1}^{4+}$ phosphor (yellow solid) was obtained.

Example 2

0.4776 g (1.8 mmol) of potassium hexafluorogermanate ($K_2GeF_6$) and 0.0494 g (0.2 mmol) of $K_2MnF_6$ were dissolved in 6 mL, 48 wt % of hydrofluoric acid (HF) solution at 25° C. and stirred for 10 minutes to form a first solution. Then, 20 mL of anhydrous ethanol was added to the first solution at room temperature and stirred for 10 minutes to produce a precipitate. Afterwards, after being washed twice with 30 mL of ethanol and washed once with 30 mL of acetone, the precipitate was oven-dried at 50° C. for 2 hours. Then, 0.493 g of $K_2Ge_{0.9}F_6:Mn_{0.1}^{4+}$ phosphor (yellow solid) was obtained.

Example 3

0.4776 g (1.8 mmol) of potassium hexafluorogermanate ($K_2GeF_6$) and 0.0494 g (0.2 mmol) of $K_2MnF_6$ were dissolved in 10 mL, 48 wt % of hydrofluoric acid (HF) solution at 25° C. and stirred for 10 minutes to form a first solution. Then, 5 mL of anhydrous ethanol was added to the first solution at room temperature and stirred for 10 minutes to produce a precipitate. Afterwards, after being washed twice with 30 mL of ethanol and washed once with 30 mL of acetone, the precipitate was oven-dried at 50° C. for 2 hours. Then, 0.491 g of $K_2Ge_{0.9}F_6:Mn_{0.1}^{4+}$ phosphor (yellow solid) was obtained.

The amount and ratio of materials added in Examples 1-3 are shown in the following Table 1.

TABLE 1

| Example | $K_2GeF_6$ (mmol) | $K_2MnF_6$ (mmol) | HF (mL) | anhydrous ethanol (mL) | $V_{(HF)}$:$n_{(fluoride)}$ (L/mol) | $V_{(ethanol)}$:$n_{(fluoride)}$ (L/mol) | total concentration of fluoride ions (M) |
|---|---|---|---|---|---|---|---|
| 1 | 1.8 | 0.2 | 10 | 20 | 5 | 10 | 19.16 |
| 2 | 1.8 | 0.2 | 6 | 20 | 3 | 10 | 13.26 |
| 3 | 1.8 | 0.2 | 6 | 5 | 3 | 2.5 | 31.36 |

According to the above description and Table 1, the total concentration of fluoride ions of hydrofluoric acid solution, the fluoride including potassium hexafluorogermanate ($K_2GeF_6$) and $K_2MnF_6$ was regulated to 19.16M, 13.26M, and 31.36M. Such concentration change may also be considered as being completed by regulating the ratio of the volume of hydrofluoric acid solution and the amount of fluoride including potassium hexafluorogermanate ($K_2GeF_6$) and $K_2MnF_6$ ($V_{(HF)}$:$n_{(fluoride)}$), and by regulating the ratio of the volume of anhydrous ethanol and the amount of fluoride including potassium hexafluorogermanate ($K_2GeF_6$) and $K_2MnF_6$ ($V_{(ethanol)}$:$n_{(fluoride)}$). As shown in Table 1, the total concentration of fluoride ions was 19.16M when $V_{(HF)}$:$n_{(fluoride)}$ was 5 (L/mol) and $V_{(ethanol)}$:$n_{(fluoride)}$ was 10 (L/mol). The total concentration of fluoride ions was 13.26M when $V_{(HF)}$:$n_{(fluoride)}$ was 3 (L/mol) and $V_{(ethanol)}$:$n_{(fluoride)}$ was 10 (L/mol). The total concentration of fluoride ions was 31.36M when $V_{(HF)}$:$n_{(fluoride)}$ was 3 (L/mol) and $V_{(ethanol)}$:$n_{(fluoride)}$ was 2.5 (L/mol).

Emission Spectra

The emission spectra of $K_2Ge_{0.9}F_6:Mn_{0.1}^{4+}$ phosphors obtained in Examples 1-3 were measured. The results are shown in FIG. 5.

Figure 5:
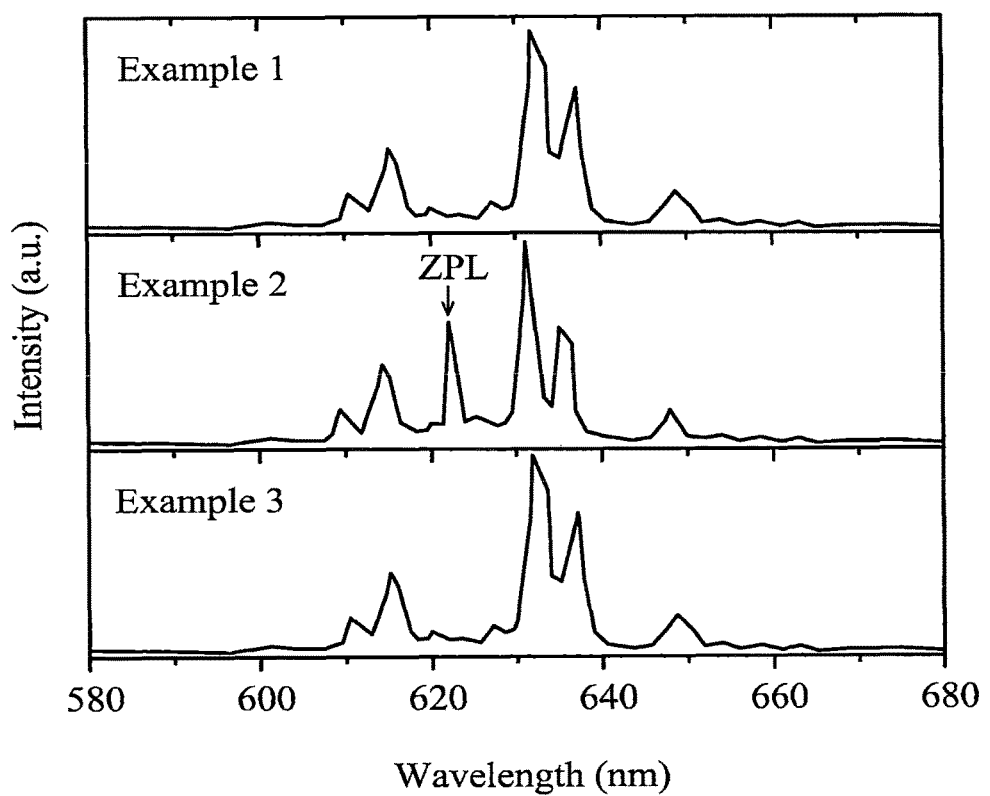
FIG. 5 illustrates emission spectra of $K_2[Ge_{1-x}F_6]:Mn_x^{4+}$ phosphors obtained by various embodiments of the present disclosure.

From FIG. 5, it can be clearly observed that the spectral positions of the emission lights of $K_2Ge_{0.9}F_6:Mn_{0.1}^{4+}$ phosphors obtained in Examples 1-3 were all at about 600 nm to about 650 nm. It reveals that red light-emitting phosphors were successfully fabricated when the total concentration of fluoride ions was 19.16M, 13.26M, or 31.36M. In addition, it can be observed that no zero phonon line (ZPL) was observed in $K_2Ge_{0.9}F_6:Mn_{0.1}^{4+}$ phosphors obtained in Examples 1 and 3. However, a zero phonon line (ZPL) having a peak wavelength in a range of about 618 nm to about 625 nm was clearly observed in the $K_2Ge_{0.9}F_6:Mn_{0.1}^{4+}$ phosphor obtained in Example 2. It reveals that phosphors further show a zero phonon line (ZPL) when the total fluoride concentration is 13.26M.

X-Ray Diffraction (XRD) Patterns

The X-ray diffraction (XRD) patterns of $K_2Ge_{0.9}F_6:Mn_{0.1}^{4+}$ phosphors obtained in Examples 1-3 were recorded with an X-ray powder diffractometer. The results are shown in FIG. 6.

Figure 6:
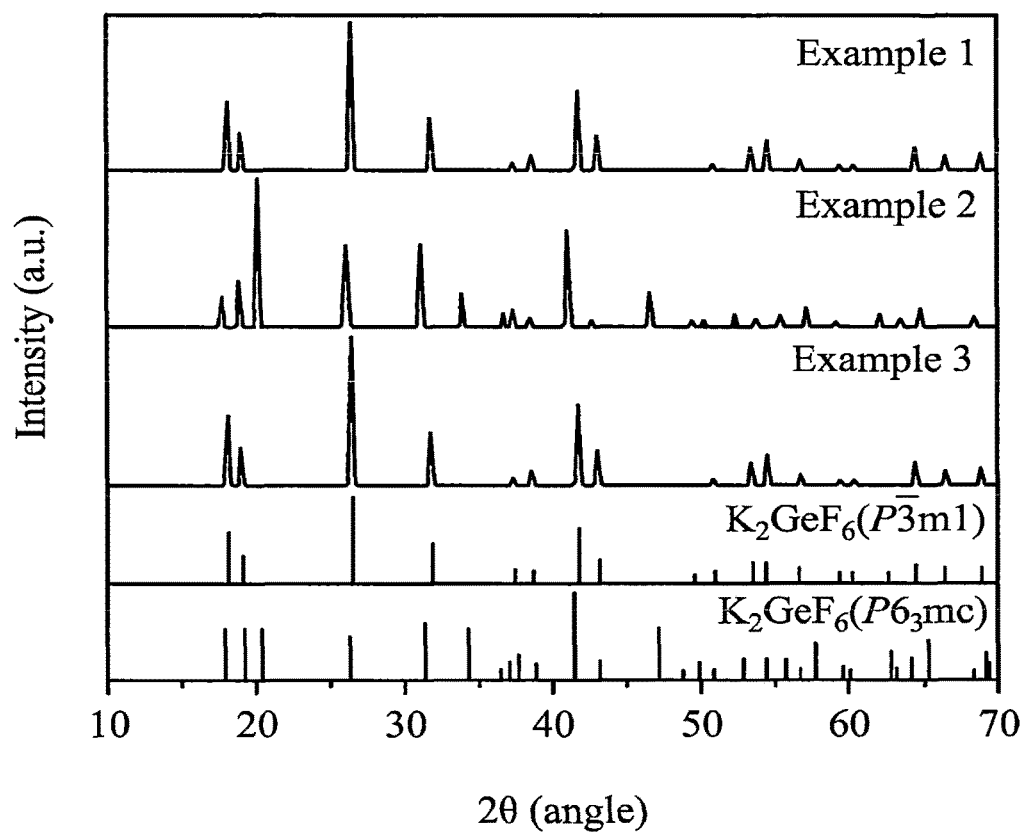
FIG. 6 illustrates X-ray diffraction (XRD) patterns of $K_2[Ge_{1-x}F_6]:Mn_x^{4+}$ phosphors obtained by various embodiments of the present disclosure.

The two rows from the bottom of FIG. 6 show the standard pattern of $K_2GeF_6$ having a hexagonal phase with a $P\bar{3}m1$ space group and the standard pattern of $K_2GeF_6$ having a hexagonal phase with a $P6_3mc$ space group. It can be observed from FIG. 6 that the X-ray diffraction (XRD) patterns of $K_2Ge_{0.9}F_6:Mn_{0.1}^{4+}$ phosphors formed in Examples 1 and 3 were similar to the standard pattern of $K_2GeF_6$ having a hexagonal phase with a $P\bar{3}m1$ space group. On the contrary, the X-ray diffraction (XRD) patterns of $K_2Ge_{0.9}F_6:Mn_{0.1}^{4+}$ phosphors formed in Example 2 was similar to the standard pattern of $K_2GeF_6$ having a hexagonal phase with a $P6_3mc$ space group. These results correspond to the results of the emission spectra, which reveal that $K_2Ge_{0.9}F_6:Mn_{0.1}^{4+}$ phosphors having a hexagonal phase with a $P6_3mc$ space group show a zero phonon line (ZPL).

Surface Morphology

The surface morphologies of $K_2Ge_{0.9}F_6:Mn_{0.1}^{4+}$ phosphors obtained in Examples 1-3 were observed using a scanning electron microscope (SEM). The results are shown in FIGS. 7A-7C.

Figure 7A:
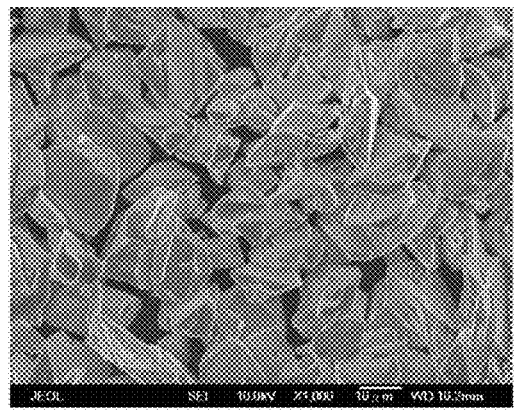
FIGS. 7A-7C illustrate the surface morphologies of $K_2[Ge_{1-x}F_6]:Mn_x^{4+}$ phosphors obtained by various embodiments of the present disclosure.
Figure 7B:
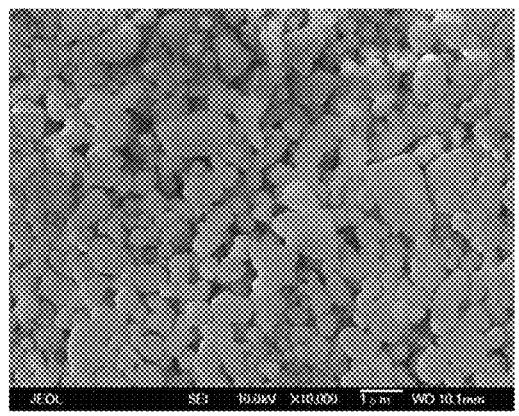
Figure 7C:
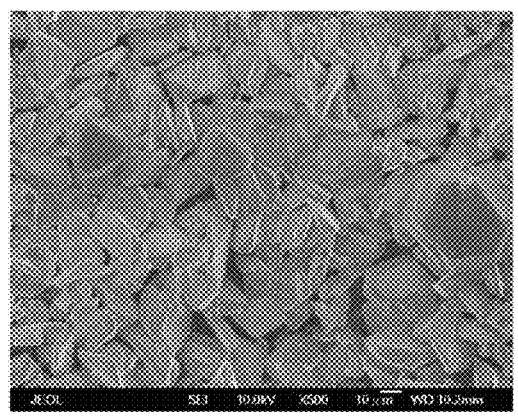

It can be observed from FIG. 7A that the particle size of the $K_2Ge_{0.9}F_6:Mn_{0.1}^{4+}$ phosphor obtained in Example 1 is in a range of 10 μm to 20 μm. It can be observed from FIG. 7B that the particle size of the $K_2Ge_{0.9}F_6:Mn_{0.1}^{4+}$ phosphor obtained in Example 2 is in a range of 0.3 μm to 1 μm. It can be observed from FIG. 7C that the particle size of the $K_2Ge_{0.9}F_6:Mn_{0.1}^{4+}$ phosphor obtained in Example 3 is in a range of 0.3 μm to 30 μm.

From the above, the present disclosure provides a phosphor formed by chemical recrystallization and a fabricating method thereof. The fabricating method for phosphors provided in the present disclosure forms red light-emitting phosphors by adding an anhydrous ethanol at room temperature to decrease the total concentration of fluoride ions in the solution. Since there is no need to evaporate hydrogen fluoride (HF) at a high temperature, the method is safe and fast. Moreover, by regulating the amount of anhydrous ethanol, the resulting red light-emitting phosphor may change the crystal phase to a hexagonal phase with a P6$_3$mc space group and show a zero phonon line (ZPL) at about 620 nm to about 625 nm. The resulting phosphor may be applied to enable blue light-emitting diodes to produce a red fluorescence. Also, the resulting fluoride phosphor may be applied to a blue LED chip accompanied by YAG yellow light-emitting phosphor (Y$_3$Al$_5$O$_{12}$:Ce; Yttrium aluminum garnet) and/or green light-emitting phosphor to produce white light and increase the color rendering index. The present disclosure further provides a method for regulating a crystal phase of a phosphor and a method for changing a crystal phase of a phosphor. These methods may be performed at room temperature. Moreover, these methods accomplish the goal of directly controlling the crystal phase of phosphors by adding anhydrous ethanol at room temperature to control the total concentration of fluoride ions in the solution and finish the reaction in a short time. There is no need to evaporate hydrogen fluoride (HF) at a high temperature. These methods are safer and easier in operation.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a phosphor, comprising:
   (a) providing a first solution, wherein the first solution is formed by dissolving potassium hexafluorogermanate (K$_2$GeF$_6$) and either K$_2$MnF$_6$ or KMnO$_4$ in a hydrofluoric acid solution;
   (b) adding an anhydrous ethanol to the first solution to make a total concentration of fluoride ions of potassium hexafluorogermanate (K$_2$GeF$_6$), hydrofluoric acid, and either K$_2$MnF$_6$ or KMnO$_4$ equal to or less than 48M to form a precipitate; and
   (c) collecting the precipitate after step (b).

2. The method for fabricating the phosphor as claimed in claim 1, wherein step (a) and step (b) are performed at room temperature.

3. The method for fabricating the phosphor as claimed in claim 1, wherein the phosphor emits a red light having a peak wavelength in a range of about 600 nm to about 650 nm after being excited by a light having a peak wavelength in a range of about 320 nm to about 500 nm.

4. The method for fabricating the phosphor as claimed in claim 1, wherein the phosphor has a particle size in a range of about 0.3 µm to about 30 µm.

5. The method for fabricating the phosphor as claimed in claim 1, wherein the total concentration of fluoride ions of potassium hexafluorogermanate (K$_2$GeF$_6$), hydrofluoric acid, and either K$_2$MnF$_6$ or KMnO$_4$ in step (b) is in a range of about 23M to 48M.

6. The method for fabricating the phosphor as claimed in claim 5, wherein the phosphor has a particle size in a range of about 10 µm to about 30 µm.

7. A method for fabricating a phosphor, comprising:
   (a) providing a first solution, wherein the first solution is formed by dissolving potassium hexafluorogermanate (K$_2$GeF$_6$) and either K$_2$MnF$_6$ or KMnO$_4$ in a hydrofluoric acid solution;
   (b) adding an anhydrous ethanol to the first solution to make a total concentration of fluoride ions of potassium hexafluorogermanate (K$_2$GeF$_6$), hydrofluoric acid, and either K$_2$MnF$_6$ or KMnO$_4$ equal to or less than 16M to form a precipitate; and
   (c) collecting the precipitate after step (b).

8. The method for fabricating the phosphor as claimed in claim 7, wherein step (a) and step (b) are performed at room temperature.

9. The method for fabricating the phosphor as claimed in claim 7, wherein the phosphor emits a red light having a peak wavelength in a range of about 600 nm to about 650 nm after being excited by a light having a peak wavelength in a range of about 320 nm to about 500 nm.

10. The method for fabricating the phosphor as claimed in claim 7, wherein the phosphor shows a zero phonon line (ZPL) having a peak wavelength in a range of about 620 nm to about 625 nm.

11. The method for fabricating the phosphor as claimed in claim 7, wherein the phosphor has a particle size in a range of about 0.3 µm to about 1 µm.

12. A phosphor represented by the following formula:

$$K_2[Ge_{1-x}F_6]:Mn_x^{4+}, \text{ wherein } 0<x<0.2,$$

wherein the phosphor has a hexagonal phase with a P6$_3$mc space group, and the phosphor is fabricated by the method as claimed in claim 7;
wherein the phosphor has a particle size in a range of about 0.3 µm to about 1 µm.

13. A method for regulating a crystal phase of a phosphor, comprising:
   (a) providing a first solution, wherein the first solution is formed by dissolving potassium hexafluorogermanate (K$_2$GeF$_6$) and either K$_2$MnF$_6$ or KMnO$_1$ in a hydrofluoric acid solution; and
   (b) adding an anhydrous ethanol to the first solution to regulate a total concentration of fluoride ions of potassium hexafluorogermanate (K$_2$GeF$_6$), hydrofluoric acid, and either K$_2$MnF$_6$ or KMnO$_4$ to control the crystal phase of a resulting precipitate;
   wherein step (b) comprises regulating the total concentration of fluoride ions of potassium hexafluorogermanate (K$_2$GeF$_6$), hydrofluoric acid, and either K$_2$MnF$_6$ or KMnO$_4$ to be in a range of about 23M to 48M to make the phosphor have a hexagonal phase with a P$\bar{3}$m1 space group.

14. A method for regulating a crystal phase of a phosphor, comprising:
   (a) providing a first solution, wherein the first solution is formed by dissolving potassium hexafluorogermanate (K$_2$GeF$_6$) and either K$_2$MnF$_6$ or KMnO$_4$ in a hydrofluoric acid solution; and
   (b) adding an anhydrous ethanol to the first solution to regulate a total concentration of fluoride ions of potassium hexafluorogermanate (K$_2$GeF$_6$), hydrofluoric acid, and either K$_2$MnF$_6$ or KMnO$_4$ to control the crystal phase of a resulting precipitate;
   wherein step (b) comprises regulating the total concentration of fluoride ions of potassium hexafluorogermanate (K$_2$GeF$_6$), hydrofluoric acid, and either K$_2$MnF$_6$ or $KMnO_4$ equal to or less than 16M to make the phosphor have a hexagonal phase with a $P6_3mc$ space group.

15. A method for changing a crystal phase of a phosphor, comprising:
   (a) providing a first solution, wherein the first solution is formed by dissolving potassium hexafluorogermanate ($K_2GeF_6$) and either $K_2MnF_6$ or $KMnO_4$ in a hydrofluoric acid solution; and
   (b) adding an anhydrous ethanol to the first solution to make a total concentration of fluoride ions of potassium hexafluorogermanate ($K_2GeF_6$), hydrofluoric acid, and either $K_2MnF_6$ or $KMnO_4$ be in a range of about 16M to about 23M to change the crystal phase of a resulting precipitate;
   wherein the change of the crystal phase comprises a change between a hexagonal phase with a $P\bar{3}m1$ space group and a hexagonal phase with a $P6_3mc$ space group.

* * * * *